(12) United States Patent
Khan et al.

(10) Patent No.: US 6,624,711 B1
(45) Date of Patent: Sep. 23, 2003

(54) METHOD AND APPARATUS FOR POWER MODULATING TO PREVENT INSTANCES OF CLIPPING

(75) Inventors: Andrew Khan, Schaumburg, IL (US); Lawrence Cygan, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/166,991

(22) Filed: Jun. 11, 2002

(51) Int. Cl.[7] .................................................. H03K 7/00
(52) U.S. Cl. ........................................ 332/106; 332/115
(58) Field of Search ................................ 332/106, 107, 332/109, 112, 115

(56) References Cited

U.S. PATENT DOCUMENTS 6,011,815 A * 1/2000 Eriksson et al. ............ 375/296
6,366,177 B1 4/2002 McCune et al.
6,377,784 B2 4/2002 McCune

FOREIGN PATENT DOCUMENTS

| WO | WO 00/48306 | 8/2000 |
| WO | WO 00/48307 | 8/2000 |
| WO | WO 01/10013 A1 | 2/2001 |

* cited by examiner

Primary Examiner—Kenneth B. Wells
(74) Attorney, Agent, or Firm—Kenneth A. Haas

(57) ABSTRACT

A voltage (Vo) is added to an envelope function and input into a switching modulator (105). The output of the switching modulator ($V_{SUP}$) is input to a linear regulator (103) where amplitude compensation of $V_{SUP}$ takes place and is output as $V_{PA}$. $V_{PA}$ is then used to accomplish envelope modulation of a power amplifier (101). The value chosen for Vo is chosen to be adequate to maintain $V_{SUP}(t) > V_{PA}(t)$ over all time.

12 Claims, 12 Drawing Sheets

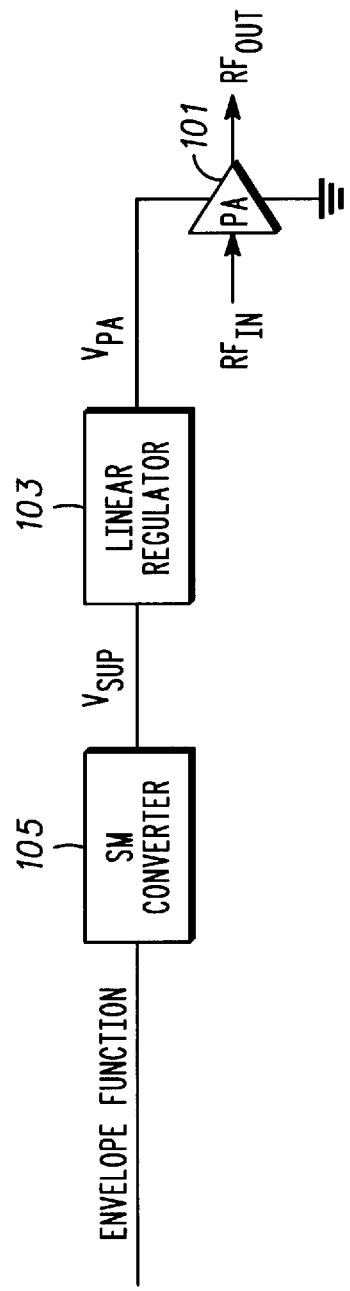
*FIG.1* — PRIOR ART —
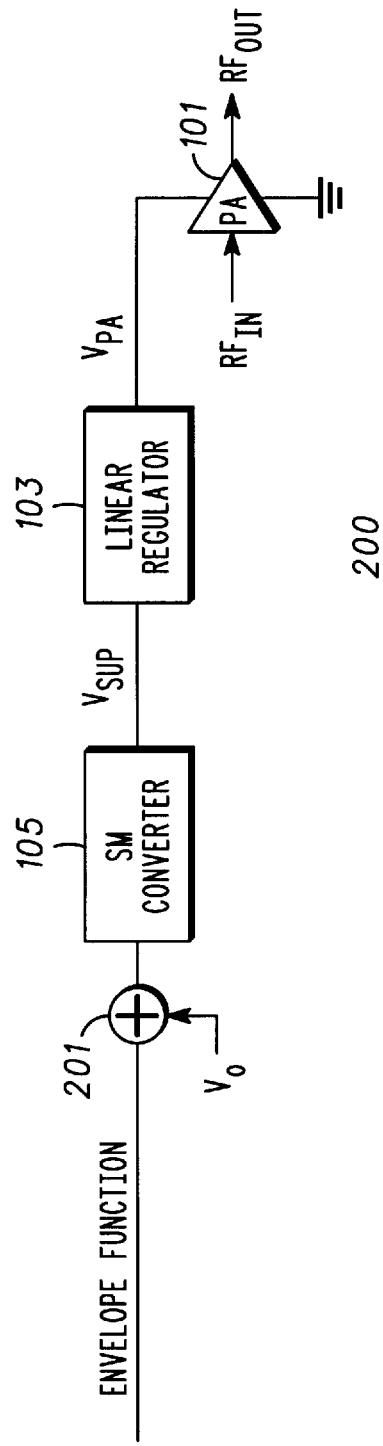
*FIG.2*

METHOD AND APPARATUS FOR POWER MODULATING TO PREVENT INSTANCES OF CLIPPING

FIELD OF THE INVENTION

The present invention relates generally to power modulators and in particular to a power modulator and method of operating a power modulator.

BACKGROUND OF THE INVENTION

Switched-mode modulators are often used for power supply modulation in radio transmitters as a means to improve the efficiency of RF power amplifiers. In either the envelope tracking (ET) technique, or envelope elimination and restoration method (EER), an efficient switching power supply is used to vary the supply voltage of a power amplifier according to an envelope function. The power amplifier is operated at or near saturation, where its efficiency is optimal.

It is well known that the frequency of the switching power modulator must generally be at least 10 times the modulation bandwidth of the amplified signal so to accurately comply with the envelope function and ease filtering requirements. Where large signal bandwidths are used, the required switching rate may exceed that practically attainable, or may be high enough that significant switching losses are incurred.

In order to address these issues, prior art solutions have attempted to control the supply voltage using a combination of a switch-mode converter stage for gross power level control and a subsequent linear regulator stage for precise power envelope control. Such a prior-art solution is shown in FIG. 1 and described in detail in the International Application WO 00/48306 HIGH-EFFICIENCY AMPLIFIER AND BURST CONTROL. As shown in FIG. 1, amplifier 101 is preceded by linear regulator 103 and switching modulator (or switch-mode converter) 105. Although the above solution does allow for more efficient operation of amplifier 101, a problem exists in that oftentimes clipping occurs in amplifier 101. More particularly, in order to avoid saturation of linear regulator 103 and clipping of the envelope function, $V_{PA}$ must be held less than $V_{SUP}$. Because the prior-art solution discussed above fails to assure that $V_{SUP} > V_{PA}$ clipping often occurs. Therefore a need exists for a power modulator and method of operating a power modulator that prevents saturation of linear regulator 103 and clipping amplifier 101.

BRIEF DESCRIPTION OF THE DRAWING

FIG. 1 is a block diagram of a prior-art power amplifier circuit.

FIG. 2 is a block diagram of a power modulator in accordance with the first embodiment of the present invention.

DETAILED DESCRIPTION OF THE DRAWINGS

Figure 3:
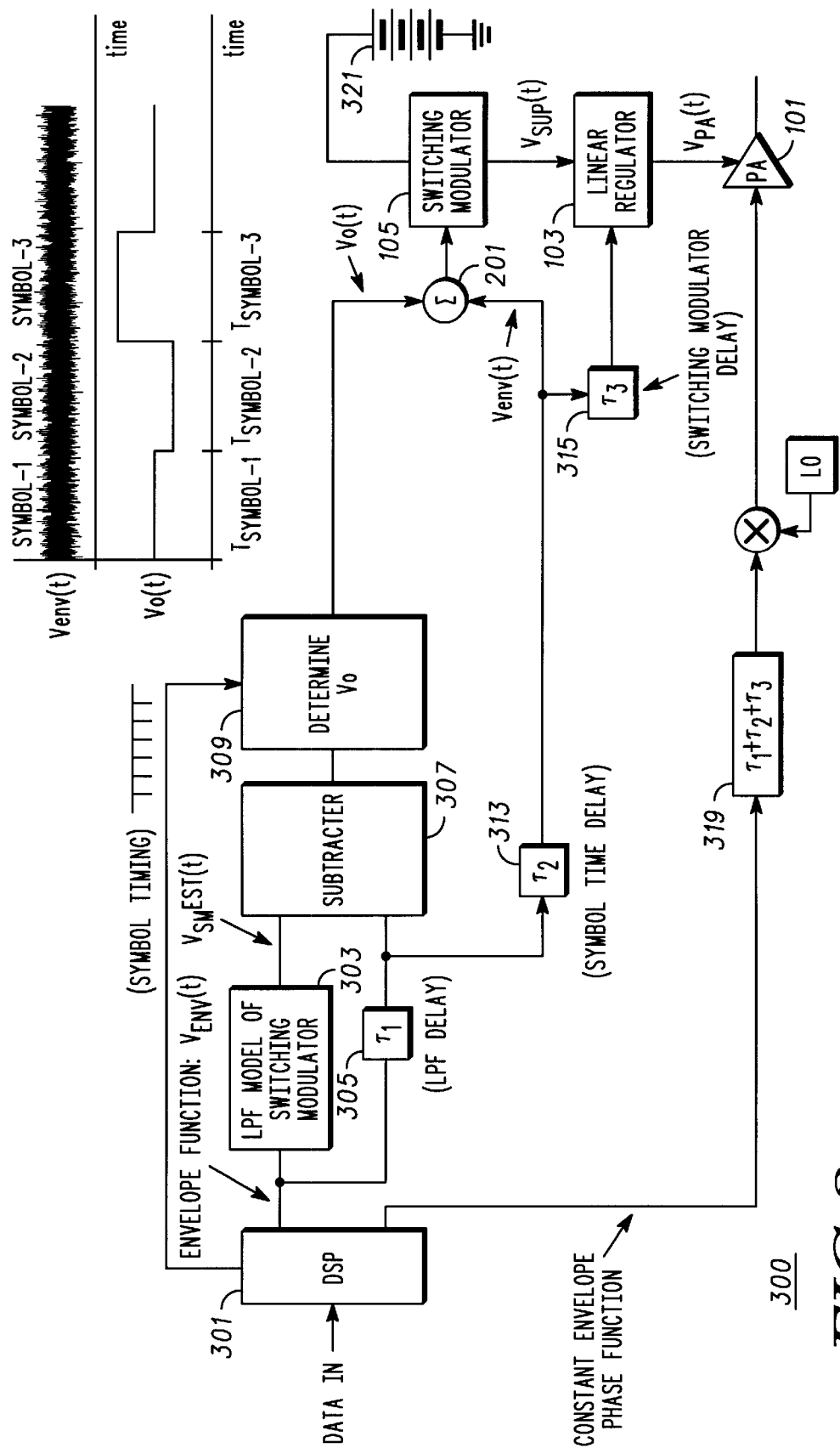
FIG. 3 is a block diagram of a power modulator in accordance with the second embodiment of the present invention.

To address the above-mentioned need a method and apparatus for power modulation is provided herein. A voltage (Vo) is added to an envelope function and input into a switching modulator. The output of the switching modulator ($V_{SUP}$) is input to a linear regulator where amplitude compensation of $V_{SUP}$ takes place and is output as $V_{PA}$. $V_{PA}$ is then used to accomplish envelope modulation of a power amplifier. The value chosen for Vo is chosen to be adequate to maintain $V_{Sup}(t) > V_{PA}(t)$ over all time.

Because the value chosen for Vo is chosen to be adequate to maintain $V_{SUP}(t) > V_{PA}(t)$ over all time, instances of clipping can be virtually eliminated. More particularly, because the input voltage ($V_{SUP}$) to the linear regulator is increased by Vo, saturation of the linear regulator can be virtually eliminated.

The present invention encompasses an apparatus comprising a switching modulator (105) having an envelope function as an input and outputting a stepped-down envelope function ($V_{SUP}(t)$), a model (303) of the switching modulator, the model having the envelope function as an input and outputting an estimate of $V_{SUP}(t)$, a predistorter having the envelope function as an input along with the estimate of $V_{SUP}(t)$ and outputting a pre-distorted version of the envelope function, and a linear pass device having $V_{SUP}(t)$ and the pre-distorted version of the envelope function as an input and outputting a reproduction of $V_{ENV}(t)$.

The present invention additionally encompasses an apparatus comprising a summer (201) having an envelope function ($V_{ENV}(t)$) as an input and a voltage (Vo) as an input, and outputting a sum of the envelope function with the voltage, a switching modulator (105) having the sum of the envelope function with the voltage as an input and outputting a stepped-down voltage ($V_{SUP}(t)$), and a linear pass device having $V_{SUP}(t)$ and the pre-distorted version of the envelope function as an input and outputting a reproduction of the envelope function.

The present invention additionally encompasses a method. The method comprises the steps of estimating an output of a switching modulator and pre-distorting an envelope function based on the estimate of the switching modulator. The envelope function is reproduced via a linear pass device, wherein the step of reproducing is based on the pre-distorted envelope function.

Turning now to the drawings, wherein like numerals designate like components, FIG. 2 is a block diagram of power modulator 200 in accordance with the a first embodiment of the present invention. As shown, an envelope function enters summer 201 where a constant voltage Vo is added to the envelope function and the summed value is input to switching modulator 105. In accordance with the present invention the envelope function comprises a wave form that is related to the magnitude of the transmitted signal. In the case of EER, the envelope function represents the time-varying amplitude of the transmitted information, which, when multiplied in the power amplifier by the phase-modulated RF carrier, results in the generation of the desired amplitude and phase modulated RF carrier signal. In ET applications, the envelope function may be the amplitude signal analogous to that used in EER, or it may be the amplitude signal further processed through mathematical operations such as polynomial expansions in order to constrain its bandwidth. The value chosen for Vo is chosen to be adequate to maintain $V_{SUP}(t) > V_{PA}(t)$ over all time, while not being so large as to cause excessive dissipation in linear regulator 103, thereby producing a degradation of overall efficiency.

Because of the delay introduced by the modulator 105, compensating delay elements (not shown) in the RF drive and linear regulator paths become necessary to insure time alignment of phase and envelope quantities at power amplifier 101. Additionally, there exists a dependence of the minimum acceptable value of Vo on the switching rate of modulator 105. Low switching rates require a larger value of Vo, thereby implying reduced efficiency over that achievable with a faster switching rate.

Because a constant voltage (Vo) is added to the envelope function, instances of clipping can be virtually eliminated. More particularly, because the input voltage ($V_{SUP}$) to linear regulator 103 is increased by Vo, saturation of linear regulator 103 can be virtually eliminated.

Although the above solution does virtually eliminate instances of clipping, a static value for Vo, which is compatible with the statistics of the modulation envelope over all time, produces less than optimal efficiency. Rather, an approach which allows Vo to be increased, as needed, to avoid saturation of the linear regulator and reduced, when possible, to improve efficiency is clearly desirable. With this in mind, in a second embodiment of the present invention, Vo is allowed to vary as a function of time. Such a solution is shown in FIG. 3.

The response of the switching modulator 105 to the envelope function $V_{ENV}(t)$ may be estimated by passing the envelope function through a suitable low pass filter model 303 resulting in $V_{SM}est(t)$. The estimate provided by the model is subtracted from the envelope function in subtracter 307, forming the quantity $V_{ENV}(t) - V_{SM}est(t)$. Both $V_{ENV}(t)$ and $V_{SM}est(t)$ are envelope signal quantities, implying that their values are always non-negative. When $V_{ENV}(t) \geq V_{SM}est(t)$, the quantity $V_{ENV}(t) - V_{SM}est(t)$ represents the minimum offset voltage value for Vo. When Vo is summed with $V_{ENV}(t)$ using summer 201 at the input of the switching modulator 105, $V_{SUP}(t)$ is produced at the output of the switching modulator. $V_{SUP}(t)$ is comprised of the switching modulator's response to the envelope function, $V_{SM}(t)$ and the offset Vo. Using $V_{SUP}(t)$ as its source, linear regulator 103 is driven by $V_{ENV}(t)$, and experiences a voltage drop given by the quantity $V_{SUP}(t) - V_{PA}(t)$. Because $V_{PA}(t)$ is reproduction of $V_{ENV}(t)$, and $V_{SM}est(t) \sim V_{SM}(t)$ the voltage drop will not be less than zero, thereby avoiding saturation of the linear regulator.

When $V_{SM}est(t) > V_{ENV}(t)$, the offset Vo is determined to be a negative value. This condition corresponds to the case where $V_{SUP}(t) > V_{PA}(t)$, for which the linear regulator functions to reduce $V_{SUP}(t)$ to the required value of $V_{PA}(t)$, regardless if an offset is present on not.

Note that in FIG. 3 that the output of subtractor 307 is input to determiner 309 where Vo for the symbol period is determined. More particularly, because $V_{SUP}(t) - V_{PA}(t)$ must be greater than zero for the entirety of the symbol period, Vo is chosen so that $Vo = \max[V_{ENV}(t) - V_{SM}est(t)]$ over the symbol period, which approximates $\max[V_{PA}(t) - V_{SUP}(t)]$ over the symbol period. Vo is then output to summer 201 to be added to the envelope function to produce a summed voltage. The summed voltage is then input to switching modulator 105. This action implies that Vo is no longer a fixed value, but rather becomes a function of time, Vo(t).

Practical linear regulators generally exhibit a small voltage drop across their pass devices when saturated. Such voltage drops are the result of finite conductor resistance, and must be compensated for by their addition to the value determined for Vo to insure saturation of the linear regulator is avoided.

Switching modulator 105 may be a Class D device, for example, or a switch-mode power supply (SMPS). Switching modulator 105 uses the output of summer 201 as its reference to efficiently transform a DC power source 321, as is known in the art, to a voltage that somewhat exceeds but that approximates the desired power amplifier 101 operating voltage level. That is, switching modulator 105 provides an efficient, but approximate, envelope function, $V_{SUP}(t)$. Linear regulator 103 uses wide bandwidth capabilities not present in the switching modulator to further processes the transformed voltage output of the switching modulator 105. The linear regulator amplitude compensates the transformed voltage with the information necessary to accomplish the desired precise envelope modulation of the power amplifier, thereby creating $V_{PA}(t)$. In other words, linear regulator 103 faithfully reproduces the envelope function having its amplitude compensated accordingly.

As is evident, circuitry 300 comprises multiple delay circuits 305, 313, 315, and 319. These circuits serve to delay various signals and provide proper time alignment. For example, delay circuitry 305 delays the envelope function a proper amount to time align the envelope function with the output of model 303. Likewise delay circuitry 313 serves to delay the envelope function as to properly time align the envelope function with the output of determiner 309 while delay circuitry 315 serves to properly time align the envelope function to the output of switching modulator 105. Finally, delay circuitry 319 serves to properly time align the phase function with $V_{PA}(t)$ at PA 101.

Because a voltage Vo(t) is added to the envelope function, instances of clipping can be virtually eliminated. Additionally, because Vo(t) increases and decreases as needed to avoid saturation the efficiency of circuitry 300 is greatly increased over the scenario where Vo remains constant.

It should be noted that in the second embodiment of the present invention, the periodic adjustment of Vo coincides with symbol boundaries. In many situations, such boundaries offer short (1–2 micro seconds) intervals during which Vo can ramp up or down to its appropriate value. Therefore, in the second embodiment there exists no need to account for the response time of the switching modulator involved in ramping up or down Vo when the value of Vo is adjusted. Vo is then held constant over a symbol period. This, however, is not the case when Vo is to be adjusted on a sub-symbol basis. During such sub-symbol adjustment, the ramp-up/ramp-down time for Vo should be taken into consideration in order to prevent inadvertent clipping of PA 101. Adjustment of Vo on a sub-symbol basis enables a further efficiency improvement over that afforded by adjustment of Vo at intervals corresponding to the symbol period. Such a system for sub-symbol adjustment of Vo is shown in FIG. 4.

Figure 4:
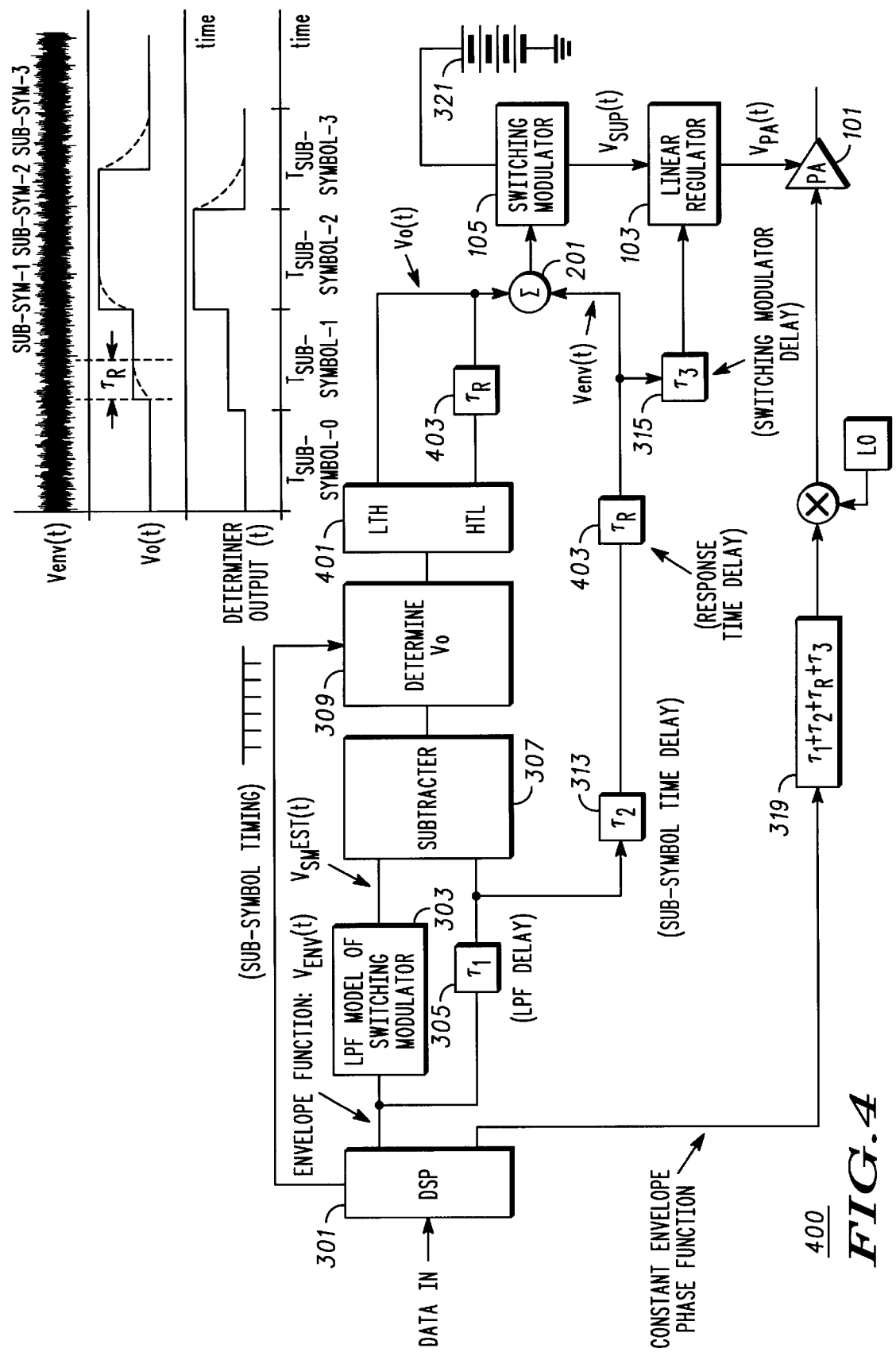
FIG. 4 is a block diagram of a power modulator in accordance with the third embodiment of the present invention.

As is evident in FIG. 4, a high-to-low/low-to-high detector 401 and delay circuit 403 have been added to the second embodiment of the present invention detailed in FIG. 3. Additionally, determiner 309 operates as discussed above except that determiner 309 outputs $\max[V_{ENV}(t)-V_{SM}est(t)]$, corresponding to $\max[V_{PA}(t)-V_{SUP}(t)]$ over the sub-symbol period of interest. Operation of circuitry 400 in FIG. 4 occurs as described above with reference to FIG. 3, however, in the second embodiment, the envelope function is delayed an additional amount $(\tau_R)$ prior to entering summer 201. When Vo is transitioning from a higher to lower voltage, the output of determiner 309 is also delayed by $\tau_R$. However, when Vo is transitioning from lower to higher voltage, the output of determiner 309 is not delayed. The effect of operating delay circuitry as such causes Vo to advance by $\tau_R$ when transitioning from a lower to higher voltage. This action provides the switching modulator with ample time to respond to the change in Vo, thereby reducing the chances that clipping will occur during voltage transitions. Additionally, when transitioning from a higher to a lower voltage, any lag time in Vo reaching the lower voltage will not cause clipping of PA 101 since Vo is operating at a higher voltage than required. Because of this, no time adjustment of Vo is made when transitioning from a higher to a lower voltage. Finally, it should be noted that for sub-symbol adjustment of Vo as described in FIG. 4, delay timer 319 is also delayed an additional $\tau_R$ so that the phase function is properly time aligned with $V_{PA}(t)$.

Realizing that efficiency is inversely proportional to Vo, it is generally desirable to set Vo to the lowest possible value which is high enough to prevent clipping of PA 101. It is further realized that maintaining Vo at elevated values for as short a time duration as possible maximizes efficiency. Allowing the sub-symbol durations to be comprised of varying-length intervals instead of fixed-length intervals minimizes the time duration for which Vo is held at an elevated value. With this in mind, a further embodiment of the present invention calculates a rise-time waveform corresponding to the response of the switching modulator to the low-to-high level transition of Vo. A fall-time waveform, corresponding to the response of the switching modulator to the high-to low-level transition of Vo is likewise calculated. Knowledge of these rise and fall waveforms allows for the determination of the length of the sub-symbol interval which minimizes the time Vo is maintained at an elevated value.

Figure 5:
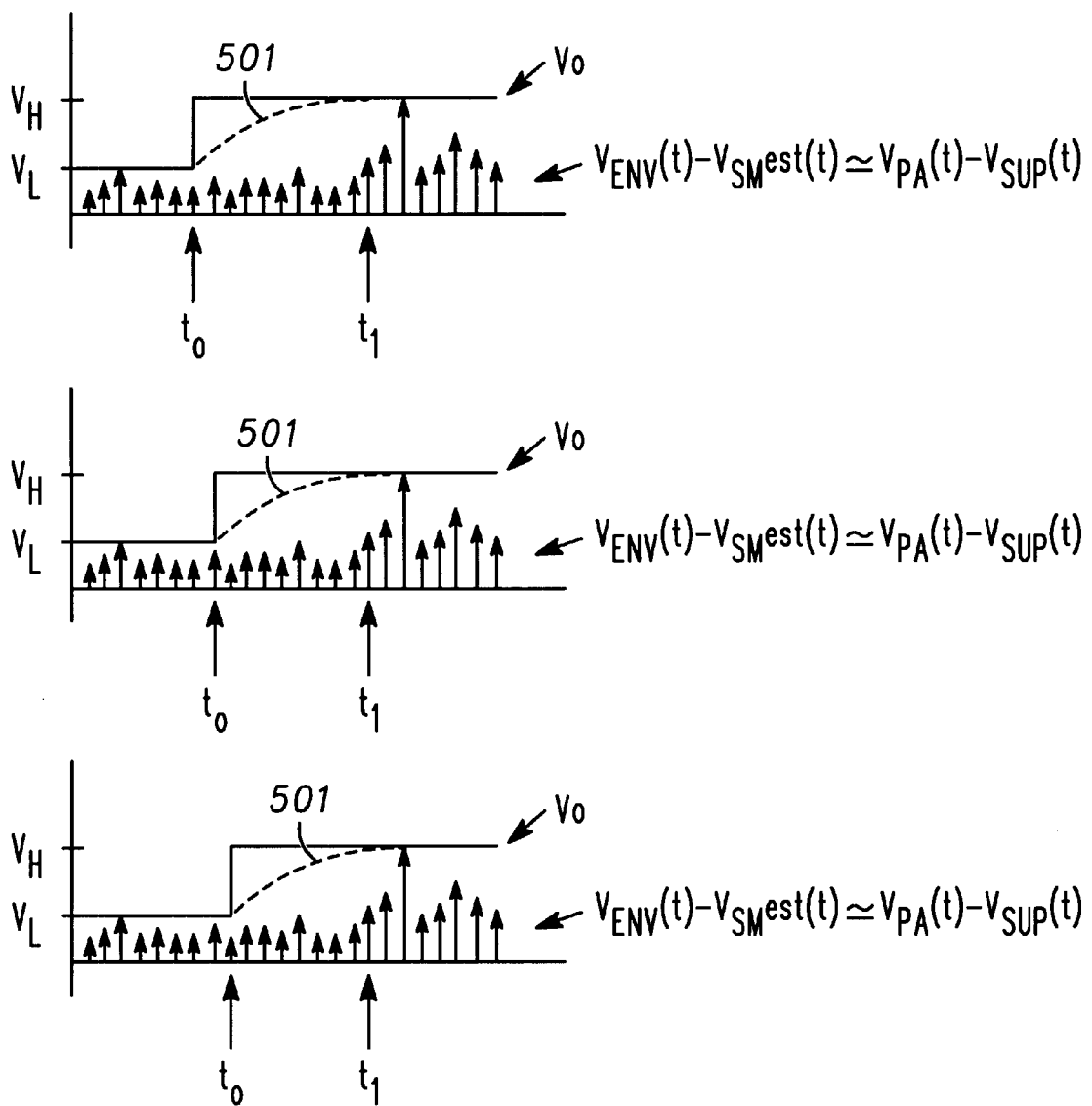
FIG. 5 illustrates rise-time waveforms.

The output of determiner 309 causes Vo to increase or decrease instantaneously at the boundaries of the sub-symbol interval. Because of practical bandwidth limitations inherent in the switching modulator, the output of switching modulator 105 exhibits finite rise-time and fall-time behavior when Vo is instantaneously increased or decreased. This is illustrated in FIG. 5 where an instantaneous plot of Vo and the corresponding response of the switching modulator to the instantaneous increase in Vo is shown. The output of the subtractor 307 (input to determiner 309) is shown as a succession of voltage samples, and is represented by the vertical arrow notation. This voltage represents instantaneous estimates of the minimum offset, $V_{ENV}(t)-V_{SM}est(t)$, corresponding to $V_{PA}(t)-V_{SUP}(t)$ which are necessary to avoid saturation of the linear regulator.

As is evident, at time $t_o$ Vo is increased from $V_L$ to $V_H$. Instead of immediately increasing from $V_L$ to $V_H$, the output of the switching modulator increases gradually, as shown by curve 501. The actual rise-time waveform follows the formula $(V_H-V_L)(1-e^{-t/\tau})$, where $\tau$ is the time constant determined by the bandwidth of the switching modulator. Similarly, the fall-time waveform can be computed from the formula $(V_H-V_L)(e^{-t/\tau})$. In yet a further element of the embodiment of the present invention, the rise time and fall times of the switching modulator are taken into consideration in determining when Vo should be increased and decreased. In particular, when increasing Vo from $V_L$ to $V_H$, a comparison is made between the rise-time waveform and the estimated minimum offset voltage samples (from the output of the subtractor) to make sure Vo is always large enough to prevent saturation of the linear regulator. If all samples of the rise-time waveform are greater than all corresponding samples of the estimated minimum offset voltage over the duration of the rise-time waveform, then the increase of Vo is delayed by one sample interval, and the process is repeated with the rise-time waveform time delayed by one sample.

A determination is made as to the maximum amount of time Vo can be delayed, yet still maintain Vo greater than all of the samples of the estimated minimum offset voltage. This is illustrated in FIG. 5 as Vo is gradually delayed until a further delay of Vo would cause the rise-time waveform to fall below the estimated minimum offset voltage required by the peak sample shown at $t_1$.

Figure 6:
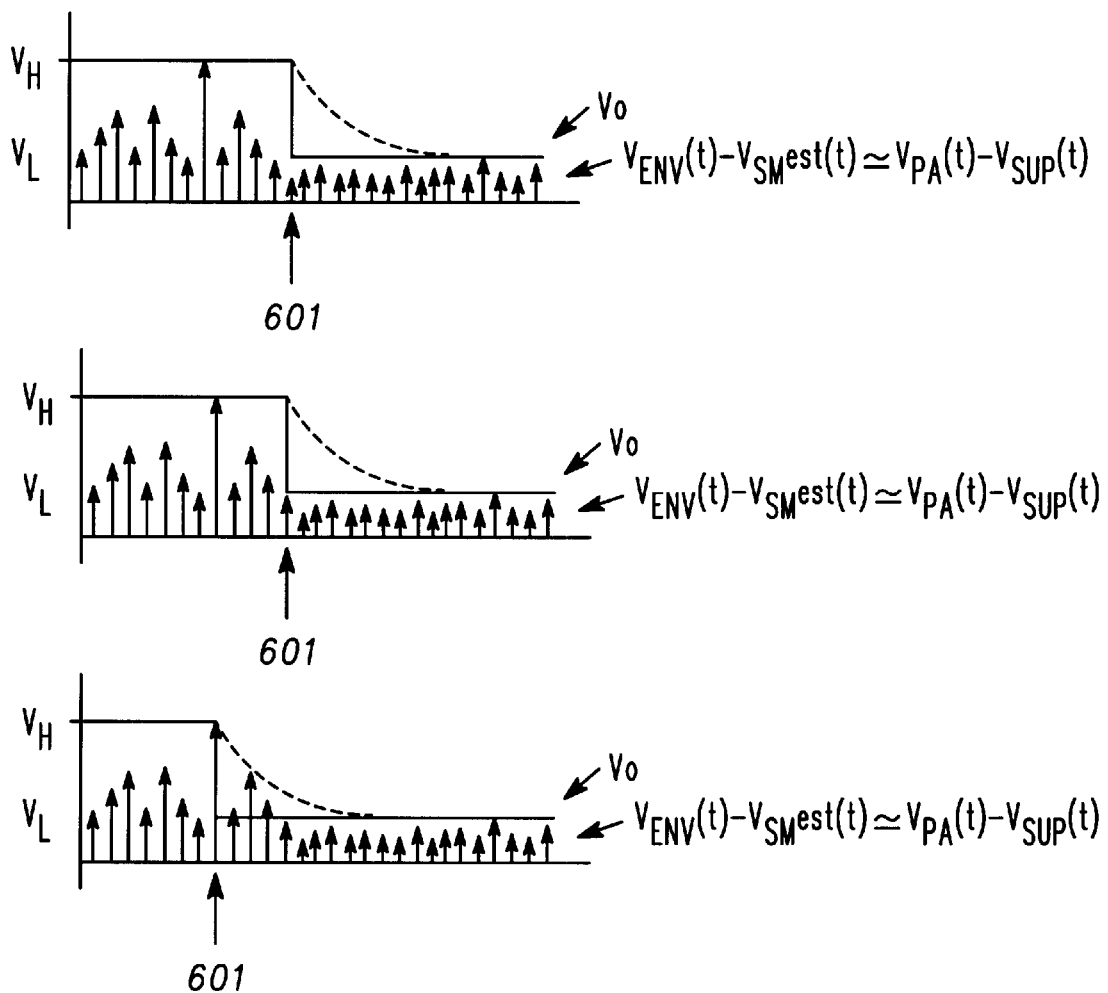
FIG. 6 illustrates fall-time waveforms.

Similarly, when transitioning from $V_H$ to $V_L$, the fall-time waveform is compared to the estimated minimum offset voltage samples within the duration of the fall-time waveform to determine an earliest time to begin the transition from $V_H$ to $V_L$ without causing Vo to fall below the estimated required minimum offset voltage. Thus, the decrease of Vo will be advanced in time by one sample interval if all samples of the fall-time waveform are greater than the corresponding estimated minimum offset voltage samples for a particular time advance. This is illustrated in FIG. 6. As shown the decrease in Vo is gradually advanced in time until a maximum time advance is determined, as indicated by point 601. Such a maximum time advance occurs at the largest time advance resulting in Vo being greater than the estimated minimum offset voltage for all points of the waveform.

Figure 7:
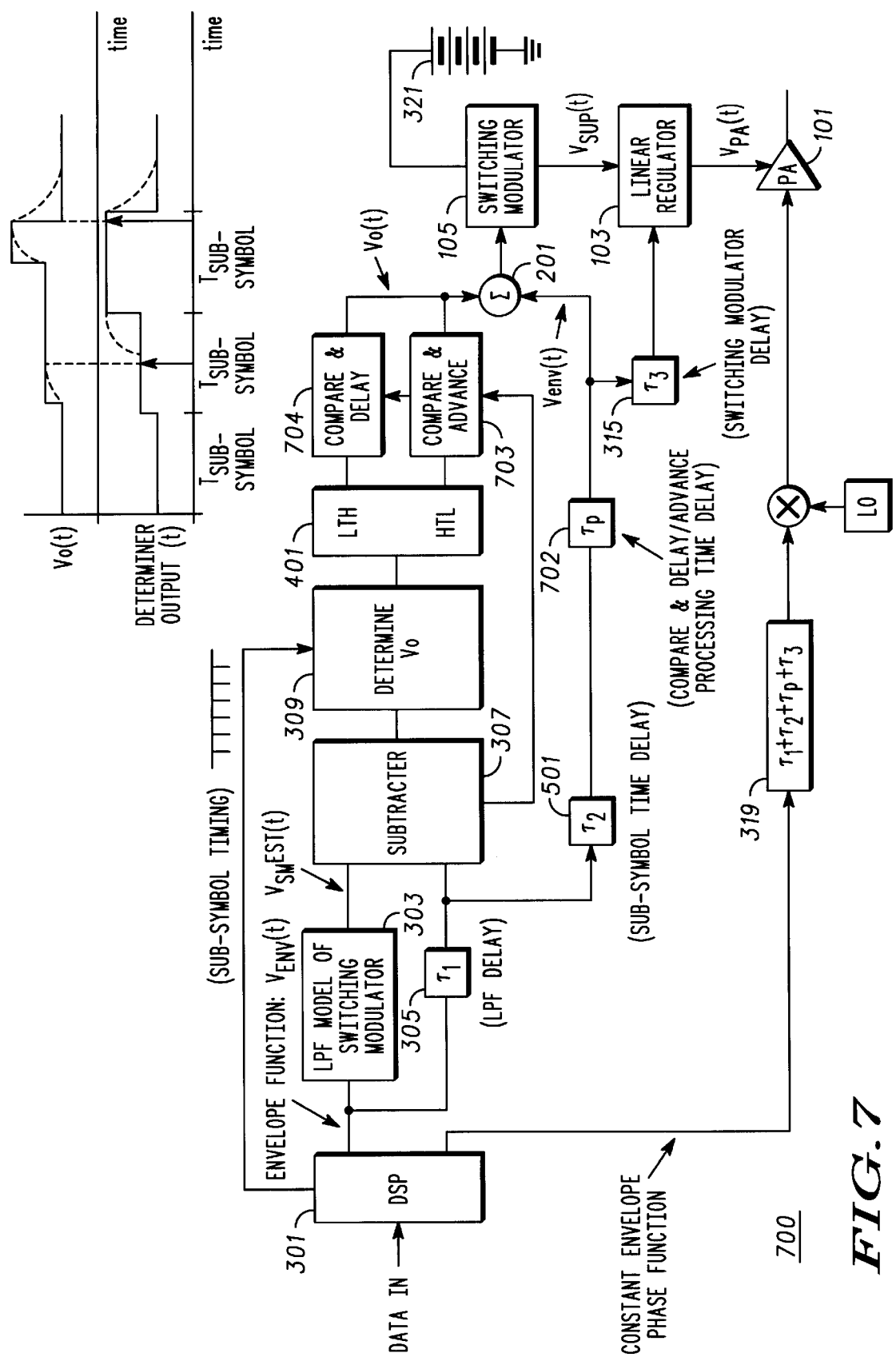
FIG. 7 is a block diagram of a power modulator in accordance with a fourth embodiment of the present invention.

FIG. 7 is a block diagram of a power modulator in accordance with a fourth embodiment of the present invention. As shown, circuitry 700 includes compare and delay circuitry 704 and compare and advance circuitry 703. During low-to-high transitions, circuitry 704 compares the rise-time waveform to the minimum offset voltage samples supplied by subtractor 307 and determines a largest delay time for Vo in order to begin increasing Vo at the greatest possible delayed time. Similarly, during high-to-low transitions circuitry 703 compares the fall-time waveform to the minimum offset voltage samples supplied by subtractor 307 and determines a greatest advancement in time that Vo can be advanced. Both advance and delay circuitry then serve to advance and delay Vo transitions accordingly (i.e., based on the actual rise-time and fall-time of Vo). It should be noted that in so determining the time delay and advance of the Vo transitions, the duration of the sub-symbol intervals becomes variable, which further acts to minimize the time duration for which Vo is held at an elevated value. By limiting the duration for which Vo is held at an elevated value, efficiency is improved.

Figure 8:
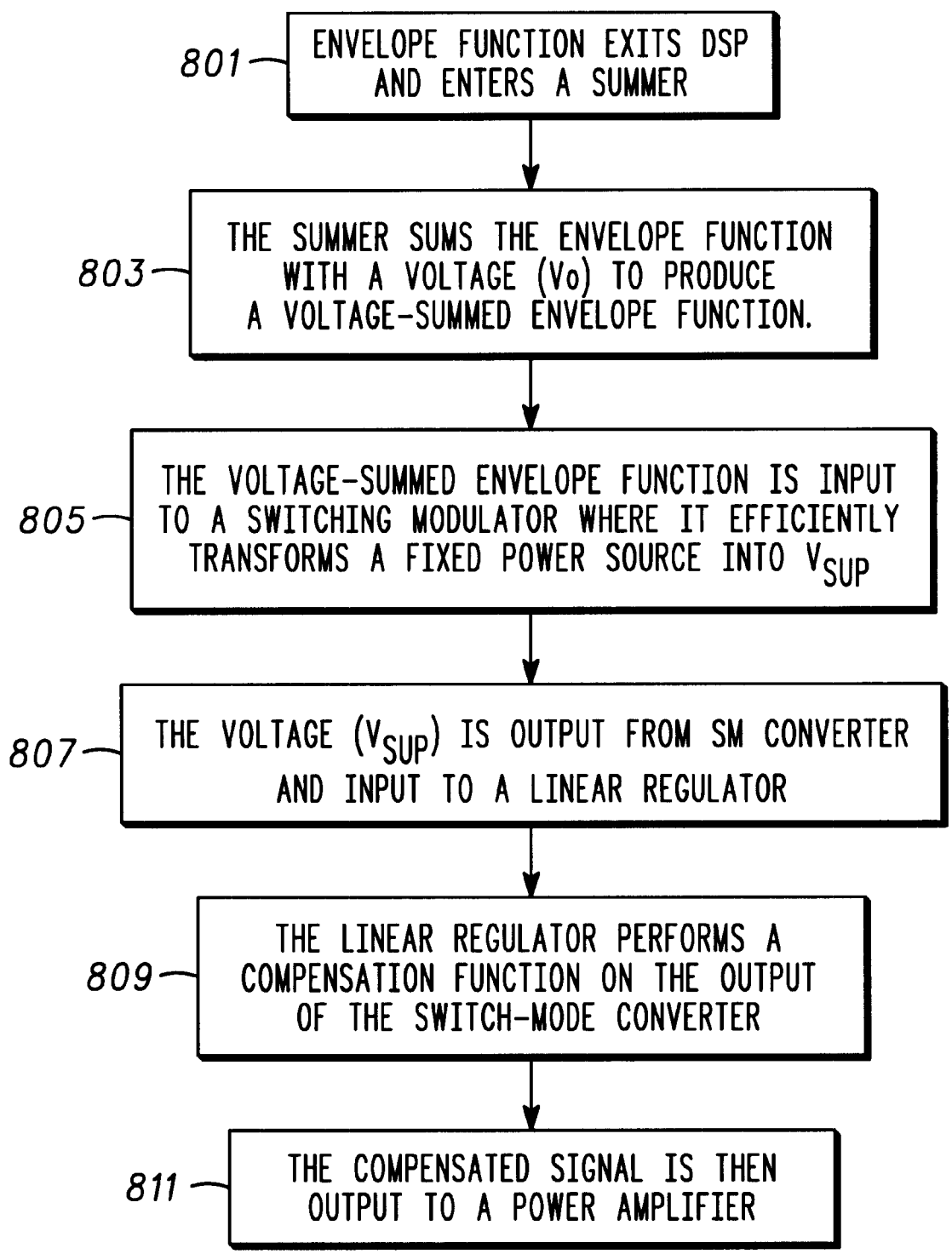
FIG. 8 is a flow chart showing operation of the power modulator in accordance with the first and second embodiments of the present invention.

FIG. 8 is a flow chart showing operation of a power modulator in accordance with the first and second embodiments of the present invention. The logic flow begins at step 801 where an envelope function exits DSP 301 and enters summer 201. At step 803 summer 201 sums the envelope function with a voltage (Vo) to produce a voltage-summed envelope function. As discussed above, in the first embodiment of the present invention Vo is held constant at a value that maintains $V_{SUP}(t) > V_{PA}(t)$ over all time. In the second embodiment of the present invention, Vo is allowed to vary with time, remaining constant on a per-symbol basis.

Continuing, at step 805 the voltage-summed envelope function is input to switching modulator 105 where it is used to efficiently transform a fixed power source to a voltage that somewhat exceeds and approximates the desired power-amplifier operating voltage level. The voltage ($V_{SUP}$) is output from SM converter 105 and input to linear regulator 103 (step 807). At step 809 linear regulator 103 performs a compensation function on the output of the switch-mode converter, generating precise power-envelope modulation. The compensated signal is then output to power amplifier 101 (step 811).

Figure 9:
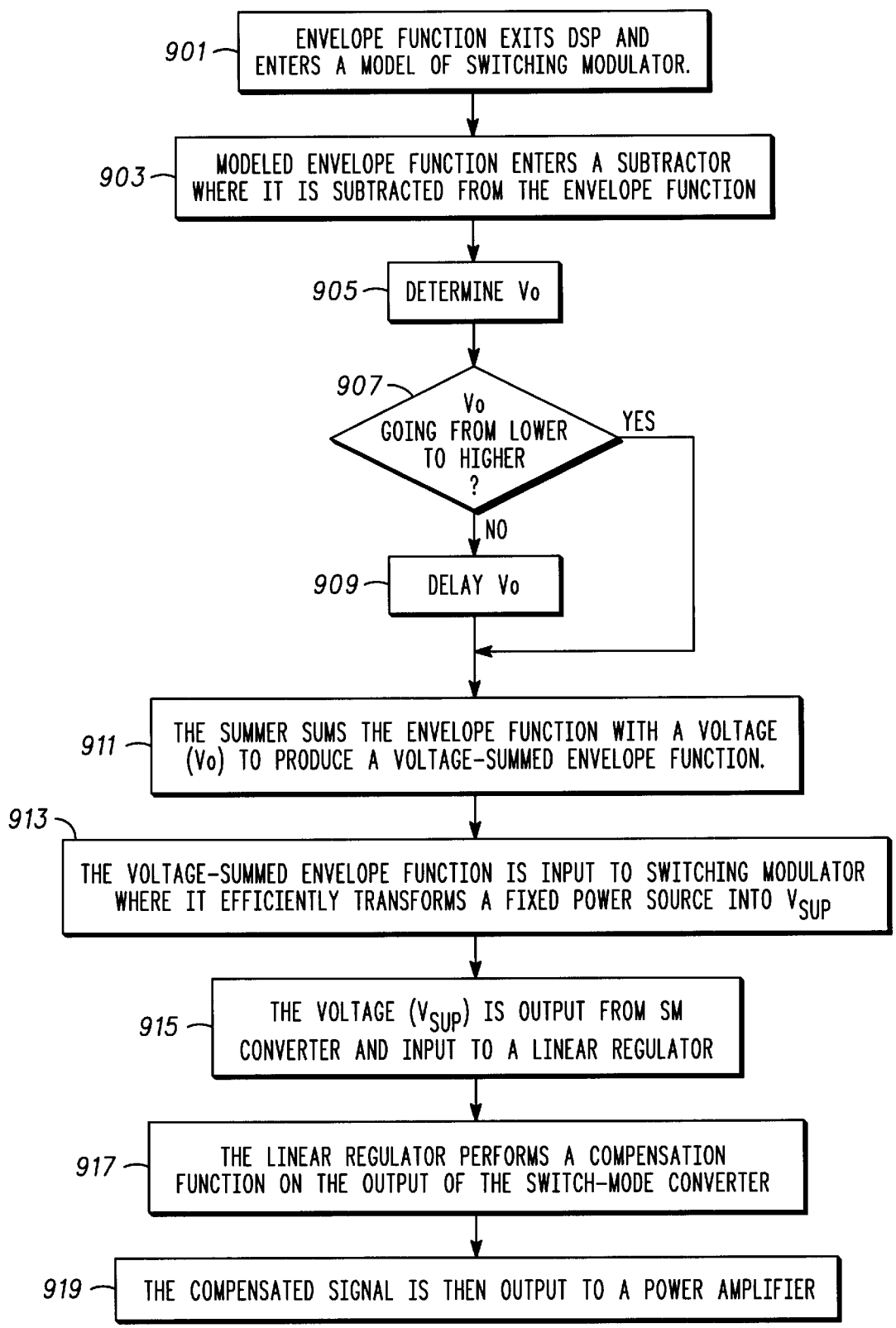
FIG. 9 is a flow chart showing operation of the power modulator in accordance with the third embodiment of the present invention.

FIG. 9 is a flow chart showing operation of a power modulator in accordance with the third embodiment of the present invention. The logic flow begins at step 901 where an envelope function exits DSP 301 and enters a model of a switching modulator 303. Model (303) of the switching modulator has the envelope function as an input and outputs an estimate of the response of the switching modulator to the envelope function, $V_{SM}est(t)$. The modeled envelope function enters a subtractor where it is subtracted from the envelope function (step 903). At step 905, Vo is determined based on the subtracted value and is output to low-high/high-low determiner 401. At step 907 a determination is made as to whether Vo is transitioning from a lower-to-higher value and if so, the logic flow continues to step 91 1, otherwise the logic flow continues to step 909 where it is delayed prior to being input into summing circuitry 201.

At step 911 summer 201 sums the envelope function with a voltage (Vo) to produce a voltage-summed envelope function. At step 913 the voltage-summed envelope function is input to switching modulator 105 where it efficiently transforms a fixed power source to a voltage that somewhat exceeds and approximates the desired power-amplifier operating voltage level. The voltage ($V_{SUP}$) is output from SM converter 105 and input to linear regulator 103 (step 915). At step 917 linear regulator 103 performs a compensation function on the output of the switch-mode converter controlling precise power-envelope modulation. The compensated signal is then output to power amplifier 101 (step 919).

Figure 10:
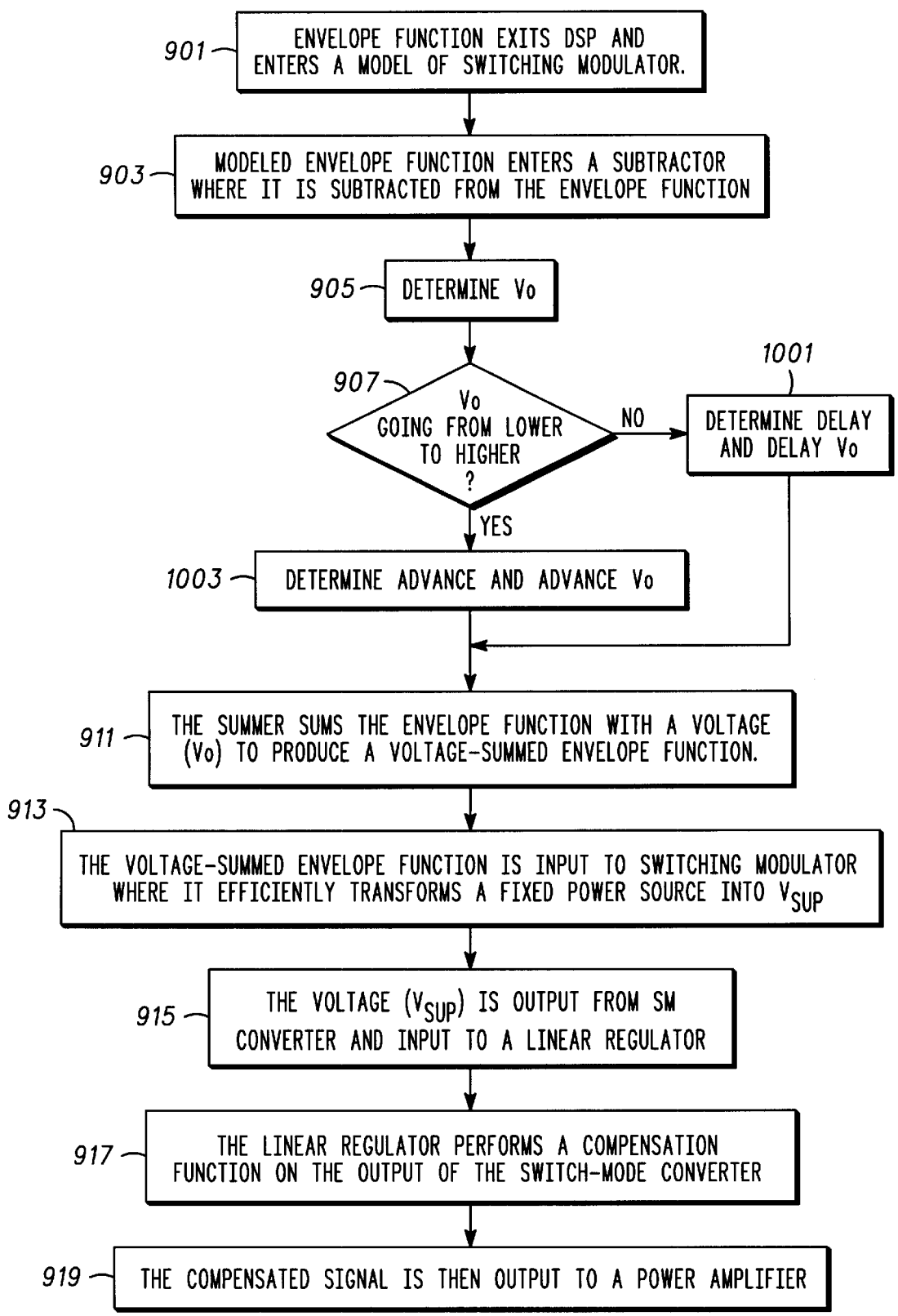
FIG. 10 is a flow chart showing operation of the power modulator in accordance with the fourth embodiment of the present invention.

FIG. 10 is a flow chart showing operation of a power modulator in accordance with the fourth embodiment of the present invention. As discussed above, the fourth embodiment of the present invention analyzes the rise time and fall time of Vo to determine an appropriate delay/advance for Vo. As is evident in FIG. 10, the logic flow is similar to that in FIG. 9 except for the addition of step 1001 in place of step 909, and the addition of step 1003. At step 1001, an appropriate time advancement for Vo is determined based on the fall time of Vo and Vo is appropriately advanced (as discussed above). Similarly, at step 1003 an appropriate time delay for Vo is determined based on the rise time of Vo, and Vo is appropriately delayed (as discussed above).

Figure 11:
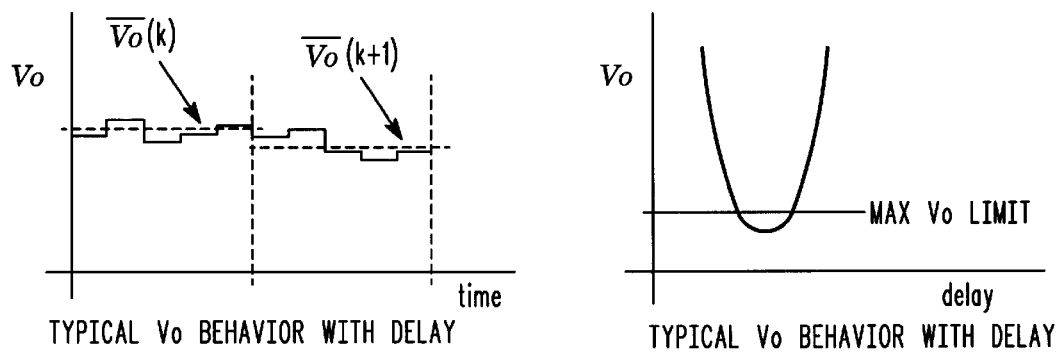
FIG. 11 illustrates the relationship between the time alignment of $V_{SUP}(t)$ and the envelope function as it relates to efficiency.

For all of the above-mentioned embodiments, the efficiency is inversely proportional to Vo. With this in mind, optimal efficiency may be maintained by insuring proper time-alignment of $V_{SUP}(t)$ with the envelope function as it enters linear regulator 103. The relationship between the time alignment of $V_{SUP}(t)$ and the envelope function as it relates to efficiency is illustrated in FIG. 11. As is evident, as the delay between $V_{SUP}(t)$ and the envelope function is increased or decreased, the efficiency varies as a parabolic function. Therefore, during operation, delay circuitry may require adjustment to compensate for delay variations which may be produced, for example, by analog circuit elements. More particularly, DSP 301 will constantly adjust a delay element, such as 315 to minimize Vo. This is accomplished as illustrated in FIG. 12.

Figure 12:
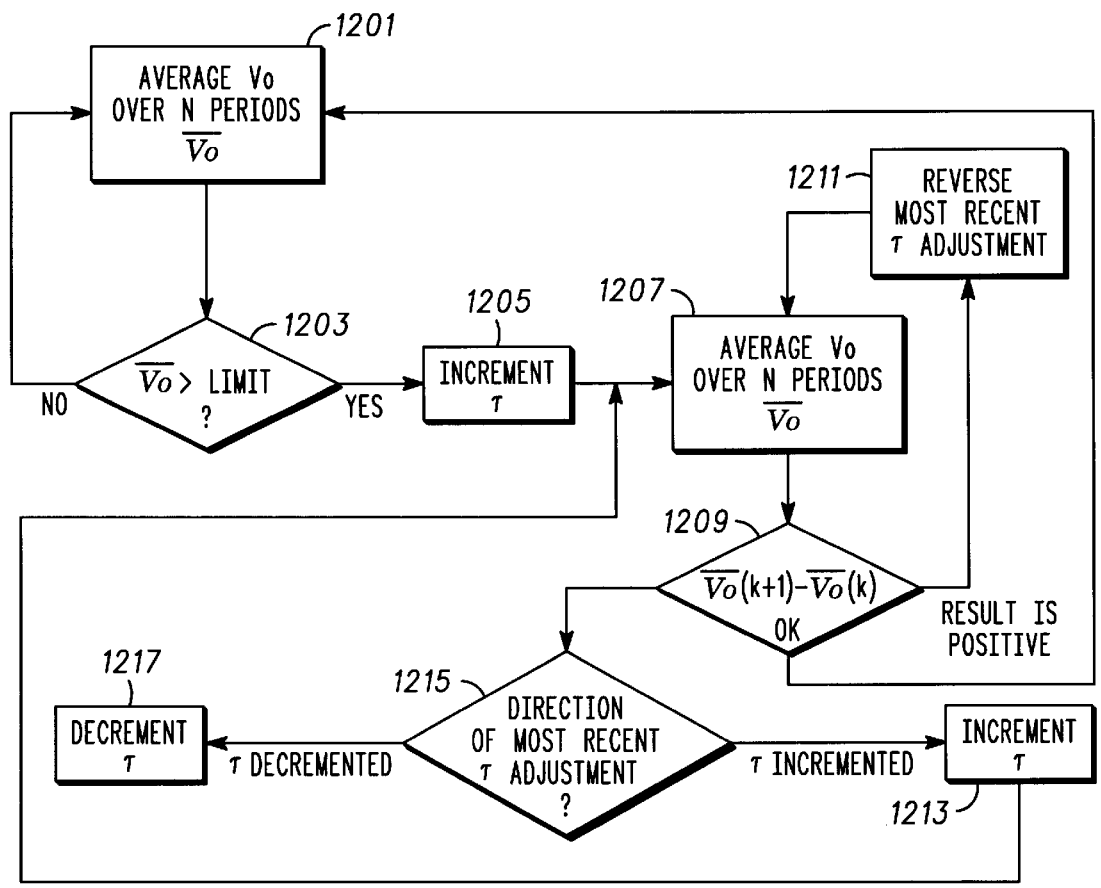
FIG. 12 is a flow chart showing operation of delay circuitry in accordance with the preferred embodiment of the present invention.

FIG. 12 is a flow chart showing operation of delay circuitry in accordance with the preferred embodiment of the present invention. The logic flow begins at step 1201 where DSP 301 averages Vo over N intervals to produce $Vo_{avg}$. Because Vo will typically vary over a succession of intervals, the trend of Vo, either increasing or decreasing, is revealed by the average value of Vo, computed over N such intervals. Here, the intervals correspond to the symbol periods or sub-symbol periods as discussed previously. In the fourth embodiment which uses intervals of variable length, $Vo_{avg}$ may be computed by integrating Vo over a time interval of sufficient length, and dividing by the length of the time interval. At step 1203 it is determined if $Vo_{avg}$ exceeds a limit. Since efficiency is inversely proportional to Vo, a minimum efficiency threshold may be set in terms of a maximum value of $Vo_{avg}$. When $Vo_{avg}$ exceeds the threshold value, an attempt to reduce $Vo_{avg}$, and hence Vo, is made by adjusting the timing delay between $V_{SUP}(t)$ and the envelope function applied to the linear regulator.

Continuing, if $Vo_{avg}$ does not exceed the limit, the logic flow simply returns to step 1201, otherwise the logic flow advances to step 1205 where the delay, τ, is incremented. That is, the delay is increased by an amount typically equal to one sample time. (Note: Since it is initially not known if the delay should be incremented (increased) or decremented (reduced) to minimize Vo, the direction of the first delay adjustment is made arbitrarily. In this example, the initial adjustment increments (increases) the delay, however a decrement (reduction) of the time delay alternatively could have been used.)

Continuing, the logic flow continues to step 1207 where a new value for $Vo_{avg}$ is determined and compared with the old value for $Vo_{avg}$ (step 1209). If the new value is greater than the old value for $Vo_{avg}$ the direction of the delay adjustment was incorrect. The logic flow continues to step 1211 where the delay direction is reversed from its original direction, changing in the opposite direction by an amount somewhat greater than one sample time, typically two sample times. The logic flow returns to step 1207 where $VO_{avg}$ is computed again. If, the new value is less than the old value for $Vo_{avg}$, the logic flow continues to step 1215. However, if the new value for $Vo_{avg}$, is substantially similar to the old value the logic flow returns to step 1201.

At step 1215 the direction of the most recent adjustment of τ is determined. If, at step 1215 it is determined that τ was decreased, the logic flow continues to step 1217 where τ is again decremented, however, if at step 1215 it is determined that τ was increased, the logic flow continues to step 1213 where τ is incremented. In both cases, the logic flow returns to step 1207 where $V_{avg}$ is recomputed. The procedure is repeated until $Vo_{avg}$ falls below the limit corresponding to optimal efficiency of the power amplifier, returning to step 1201 from 1209

The above description illustrates how a voltage offset maintains efficiency performance of a power amplifier that utilizes a switching modulator coupled to a linear regulator.

The following description modifies the above-described circuitry by replacing the linear regulator with a simple non-linear pass device. As one of ordinary skill in the art will recognize, linear regulators output a relatively linear signal, whereas pass devices are inherently non-linear in nature. More particularly, a simple pass device is typically a device such as a high power BJT connected in a manner to provide current gain—providing an interface between a low-current circuit and a high-current circuit. A linear regulator adds feedback circuitry around such a device to maintain linearity between input and output voltages. For purposes of stability, the feedback is inherently band-limited, and is therefore inadequate for a system requiring a wide bandwidth mode of operation. To enable wideband operation, the linear regulator is replaced with a pass device which is, in turn, driven by a predistortion system necessary to correct the nonlinear behavior of the pass device.

Figure 13:
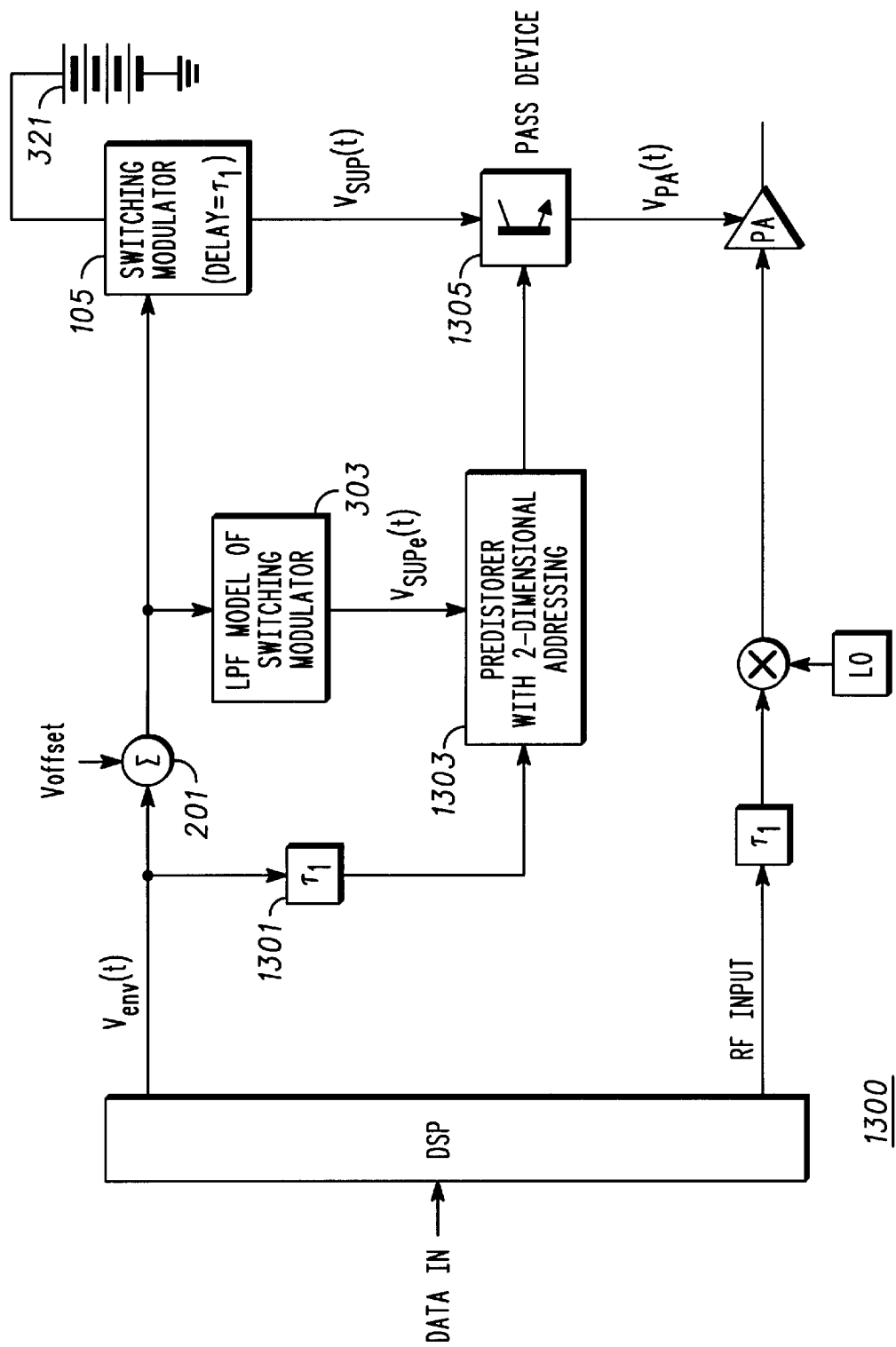
FIG. 13 is a block diagram showing a linear pass device coupled to switching modulator in accordance with a further embodiment of the present invention.

FIG. 13 is a block diagram showing pass device 1305 coupled to switching modulator 105. As shown, linear regulator 103 of the prior embodiments has been replaced by a simple unregulated pass device 1305. In order to correct for the inherent nonlinearity of pass device 1305, predistortion is utilized to correct the output of pass device 1305. Such predistortion, whether equation-based or lookup table (LUT) based, is applied to pass device 1305 within circuitry 1300 and is addressed by two independent factors to accommodate the two inputs to pass device 1305. If pass device 1305 is implemented as a BJT transistor, for example, the independent parameters for addressing predistorter 1303 are the base and collector input voltages that will be applied to pass device 1305. In a LUT-based approach, a two dimensional matrix of values existing within predistorter 1303 describe the necessary correction to maintain a linear transfer function from $V_{env}(t)$ to $V_{PA}(t)$.

Operation of circuitry 1300 occurs as follows: During operation an estimate ($V_{SUP}e(t)$) of the output of switching modulator 105 is made in a manner analogous to that described above by using a LPF model 303 of the switching power supply. As is evident the input into model 303 includes Vo as a component that may be determined in any manner discussed above, however, in alternate embodiments, Vo may not be present, with $V_{env}(t)$ simply being input into model 303. Using $V_{SUPe}(t)$ and $V_{env}(t)$ as inputs, predistorter 1303 provides an input signal into pass device 1305 to produce a linear output from pass device 1305. More particularly, if pass device 1305 is implemented as a Bipolar Junction Transistor (BJT), predistorter 1303 modifies a base voltage over time to better linearize the output (emitter) of pass device 1305. The collector voltage ($V_{SUP}e(t)$) for pass device 1305 is estimated by using LPF model 303 of the switching power supply. This voltage is used for addressing one dimension of the predistortion function in addition to a time delayed version of the original envelope function voltage, $V_{env}(t)$, which addresses the second dimension. For example, in a LUT-based predistortion implementation, the predistortion correction data is stored in a two-dimensional matrix of size M by N, where M and N define the number of rows and columns, respectively. The correction data represents a voltage applied to the input of pass device 1305 such that $V_{PA}(t)$ faithfully reproduces the value of $V_{ENV}(t)$. This correction data is predefined and quantized into M values of base voltages at each of N values of collector voltages.) At each instance of time, $V_{ENV}(t)$ addresses the row of the matrix and $V_{SUPe}(t)$ addresses the column of the matrix to determine the appropriate correction value. Alternatively, in an equation-based predistortion implementation, the correction data could be stored as M polynomials and $V_{ENV}(t)$ chooses the appropriate polynomial, $V_{SUPe}(t)$ would be the argument of the polynomial, and the correction value result would be the result of the polynomial.

Figure 14:
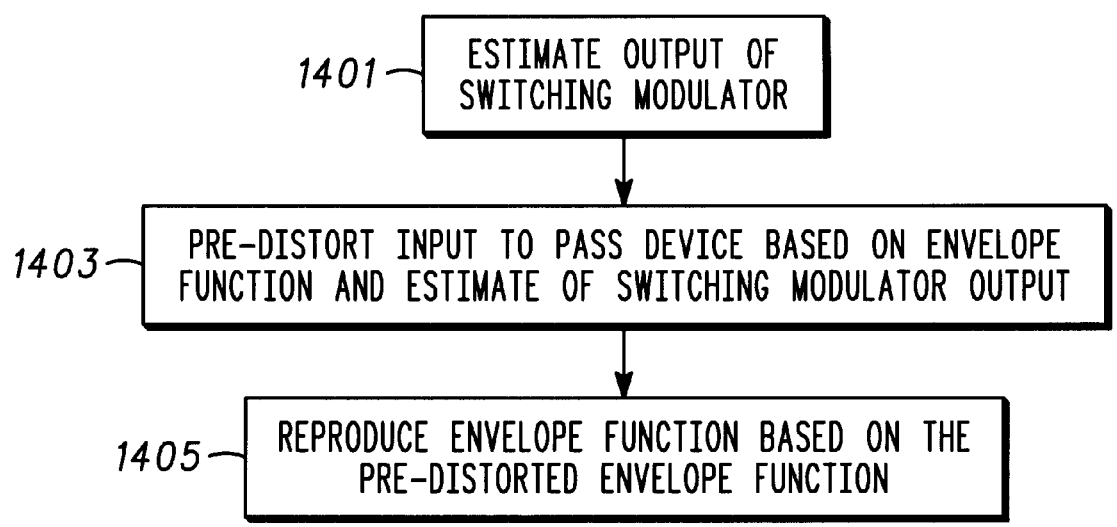
FIG. 14 is a flow chart showing operation of the circuitry of FIG. 13 in accordance with the further embodiment of the present invention.

FIG. 14 is a flow chart showing operation of the power modulator of FIG. 13 in accordance with the further embodiment of the present invention. The logic flow begins at step 1401 where an estimate of an output of a switching modulator is made. As discussed above, a low-pass filter model is used to estimate the output of switching modulator 105. At step 1403, a predistorted drive signal is generated, based on the output estimate of the switching modulator, and the envelope function and output to linear-pass device 1305. In step 1405, pass device 1305 uses the predistorted drive signal as input to reproduce the desired envelope function $V_{PA}(t)$.

While the invention has been particularly shown and described with reference to a particular embodiment, it will be understood by those skilled in the art that various changes in form and details may be made therein without departing from the spirit and scope of the invention. It is intended that such changes come within the scope of the following claims.

What is claimed is:

1. An apparatus comprising:
    a switching modulator (105) having an envelope function as an input and outputting a transformed voltage ($V_{SUP}(t)$);
    a model (303) of the switching modulator, the model having the envelope function as an input and outputting an estimate of $V_{SUP}(t)$;
    a predistorter having a delayed envelope function as an input along with the estimate of $V_{SUP}(t)$, and outputting a pre-distorted version of the envelope function; and
    a nonlinear pass device having $V_{SUP}(t)$ and the pre-distorted version of the envelope function as an input and outputting a reproduction of $V_{ENV}(t)$.

2. The apparatus of claim 1 wherein the non-linear pass device comprises a Bipolar Junction Transistor.

3. The apparatus of claim 1 further comprising a summer having the envelope function and a voltage (Vo) as an input and outputting the envelope function summed with Vo, and wherein the model of the switching modulator has the envelope function summed with Vo as an input.

4. The apparatus of claim 3 further comprising a switching modulator (105) having the sum of the envelope function with the voltage as an input and outputting a transformed voltage ($V_{SUP}(t)$).

5. The apparatus of claim 1 further comprising a switching modulator (105) having the envelope function as an input and outputting a transformed voltage ($V_{SUP}(t)$).

6. An apparatus comprising:
    a summer (201) having an envelope function ($V_{ENV}(t)$) as an input and a voltage (Vo) as an input, and outputting a sum of the envelope function with the voltage;
    as witching modulator (105) having the sum of the envelope function with the voltage as an input and outputting a transformed voltage ($V_{SUP}(t)$); and
    a non-linear pass device having $V_{SUP}(t)$ and the pre-distorted version of the envelope function as an input and outputting a reproduction of the envelope function.

7. The apparatus of claim 6 further comprising:
a model (303) of the switching modulator, the model having the envelope function as an input and outputting an estimate of $V_{sup}(t)$.

8. The apparatus of claim 7 further comprising:
a predistorter having the envelope function as an input along with the estimate of $V_{SUP}(t)$, and outputting a pre-distorted version of the envelope function.

9. A method comprising the steps of:
estimating an output of a switching modulator;
pre-distorting an envelope function based on the estimate of the switching modulator; and
reproducing the envelope function via a non-linear pass device, wherein the step of reproducing is based on the pre-distorted envelope function.

10. The method of claim 9 wherein the step of reproducing via the non-linear pass device comprises reproducing via a Bipolar Junction Transistor.

11. The method of claim 9 further comprising the step of:
receiving an envelope function;
summing the envelope function with a voltage; and
wherein the step of estimating the output of the switching modulator is based on the summed envelope function and voltage.

12. The method of claim 9 wherein the step of estimating the output of the switching modulator comprises the step of estimating, via a low-pass filter model, the output of the switching modulator.

* * * * *